(12) United States Patent
Heikkinen et al.

(10) Patent No.: US 11,362,132 B2
(45) Date of Patent: Jun. 14, 2022

(54) INTEGRATED RADIATION DETECTOR DEVICE

(71) Applicant: Detection Technology Oy, Oulu (FI)

(72) Inventors: Petteri Heikkinen, Oulu (FI); Mikko Matikkala, Oulu (FI)

(73) Assignee: Detection Technology Oy, Oulu (FI)

( * ) Notice: Subject to any disclaimer, the term of this patent is extended or adjusted under 35 U.S.C. 154(b) by 173 days.

(21) Appl. No.: 16/649,481

(22) PCT Filed: Sep. 24, 2018

(86) PCT No.: PCT/EP2018/075774
§ 371 (c)(1),
(2) Date: Mar. 20, 2020

(87) PCT Pub. No.: WO2019/063473
PCT Pub. Date: Apr. 4, 2019

(65) Prior Publication Data
US 2021/0384249 A1   Dec. 9, 2021

(30) Foreign Application Priority Data

Sep. 29, 2017   (EP) .................................... 17193925

(51) Int. Cl.
*H01L 27/146*   (2006.01)
*H01L 23/36*   (2006.01)
(Continued)

(52) U.S. Cl.
CPC .... *H01L 27/14663* (2013.01); *G01T 1/20182* (2020.05); *G01T 1/20184* (2020.05); *H01L 23/3677* (2013.01)

(58) Field of Classification Search
CPC ............. G01T 1/20182; G01T 1/20184; H01L 23/3677; H01L 27/14663
See application file for complete search history.

(56) References Cited

U.S. PATENT DOCUMENTS 5,464,984 A * 11/1995 Cox ...................... G01T 1/2018
250/370.11
2004/0136493 A1   7/2004 Konno et al.
2012/0132817 A1   5/2012 Shaw et al.

FOREIGN PATENT DOCUMENTS

WO   WO 03/077318 A1   9/2003
WO   WO 2007/117799 A2   10/2007

OTHER PUBLICATIONS

International Search Report for corresponding International Patent Application No. PCT/EP2018/075774 dated Dec. 12, 2018, 3 pages.
(Continued)

*Primary Examiner* — Mark R Gaworecki
(74) *Attorney, Agent, or Firm* — Merchant & Gould P.C.

(57) ABSTRACT

According to an embodiment, a device comprises: a scintillator layer configured to convert x-ray or gamma ray photons into photons of visible light; a photodiode layer configured to convert visible light produced by the scintillator layer into an electric current; an integrated circuit, IC, layer situated below the photodiode layer and configured to receive and process the electric current; wherein electrical contacts of the IC layer are connected to electrical contacts of the photodiode layer using wire-bonding; and wherein the wire-bonding is covered with a protective material while bottom part of the IC layer is left at least partly exposed. Other embodiments relate to a detector comprising an array of tiles according to the device; and an imaging system comprising: an x-ray source and the detector.

12 Claims, 3 Drawing Sheets

(51) Int. Cl.
 *G01T 1/20* (2006.01)
 *H01L 23/367* (2006.01)

(56) References Cited

OTHER PUBLICATIONS

Written Opinion of the International Searching Authority for corresponding International Patent Application No. PCT/EP2018/075774 dated Dec. 12, 2018, 5 pages.
Extended European Search Report for corresponding European Patent Application No. 17193925.9 dated Mar. 20, 2018, 6 pages.

* cited by examiner

INTEGRATED RADIATION DETECTOR DEVICE

This application is a National Stage Application of PCT/EP2018/075774, filed 24 Sep. 2018, which claims benefit of European Patent Application Serial No. 17193925.9, filed 29 Sep. 2017 and which applications are incorporated herein by reference. To the extent appropriate, a claim of priority is made to each of the above disclosed applications.

TECHNICAL FIELD

The present invention relates to a detector structure to be used in a radiation detector module.

BACKGROUND

Scintillator based detectors and detector arrays are utilized in radiation imaging in order to convert high energy radiation, for example x-ray or gamma ray photons, into electric charges. They are typically comprised of a scintillator layer, a photodiode layer mounted on a substrate, and an integrated circuit, IC, that analyses and processes electric currents produced by pixels in the photodiode layer. This IC can be a simple analog-to-digital converter or a more complex application specific integrated circuit, ASIC.

For improved performance, reduced cost, and smaller physical size, it may be desirable to have the IC positioned physically close to the photodiode layer. This is usually achieved by attaching the IC to opposite side of the same substrate as the photodiode layer. A simple way of doing this attachment is soldering a packaged surface mount IC onto solder pads on the substrate. However, this process includes unnecessary steps and wastes material, because for example the packaging of the IC already includes a substrate onto which the IC is attached, and this substrate includes the contact pads that are used for soldering the IC onto the detector substrate.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

It is an object to provide a detector device. The object is achieved by the features of the independent claims. Some embodiments are described in the dependent claims. According to an embodiment, a device comprises: a scintillator layer configured to convert x-ray or gamma ray photons into photons of visible light; a photodiode layer configured to convert visible light generated by the scintillator layer into an electric current; an integrated circuit, IC, layer situated below the photodiode layer and configured to receive and process the electric current; wherein electrical contacts of the IC layer are connected to electrical contacts of the photodiode layer using wire-bonding; and wherein the wire-bonding is covered with a protective material while bottom part of the IC layer is left at least partly exposed. Wire-bonding of the two layers circumvents the need for an additional substrate. Furthermore, leaving the bottom part of the IC layer exposed can significantly improve heat conduction away from the device.

In another implementation of the first aspect the device further comprises a heat sink below the IC layer for improved heat dissipation.

In other implementations of the first aspect a bottom surface of the IC layer is in a direct contact with the heat sink to further improve heat conduction from the IC layer to the heat sink.

Furthermore, in another implementation of the first aspect the heat sink may be configured as a stiffener, which removes the need for other supportive structures or thick rigid substrates.

In yet another implementation of the first aspect the device may include an x-ray blocking layer between the photodiode layer and the IC layer for protecting the electronics inside the IC layer.

In yet another implementation of the first aspect electrical contacts of the IC layer are directly connected to electrical contacts of the photodiode layer, which may reduce the size of the device.

In other implementations of the first aspect the photodiode layer further comprises a redistribution layer, which may make connecting the layers easier and simplify manufacturing of the device.

In another implementation of the first aspect the wire-bonding is covered using film-assisted moulding, which allows finer control over the distribution of the protective material.

Additionally, in another implementation of the first aspect the IC layer comprises multiple layers of stacked IC chips, which permits the device to be more compact.

Other embodiments relate to a detector comprising an array of tiles according to the device, and an imaging system comprising: an x-ray source and the detector.

Many of the attendant features will be more readily appreciated as they become better understood by reference to the following detailed description considered in connection with the accompanying drawings.

DESCRIPTION OF THE DRAWINGS

The present description will be better understood from the following detailed description read in light of the accompanying drawings, wherein.

Like references are used to designate like parts in the accompanying drawings.

DETAILED DESCRIPTION

The detailed description provided below in connection with the appended drawings is intended as a description of the embodiments and is not intended to represent the only forms in which the embodiment may be constructed or utilized. However, the same or equivalent functions and structures may be accomplished by different embodiments.

In the following description, directional terms, such as below, above, and vertical, are only used to clearly refer to the relative placement of different components of the device in the orientation that the device is depicted in the accompanying drawings.

According to an embodiment, a detector comprises a scintillator layer, a photodiode layer, a substrate, and an integrated circuit, IC, layer. The scintillator layer converts incident high energy electromagnetic radiation into visible light and the photodiode layer, in turn, converts the visible light into electric currents. These currents are routed through the substrate to the IC layer using conductors, and the analysis of these currents is handled by IC chips in the IC layer. An IC chip may refer to a separately manufactured independent IC device. For example, these chips can be simple analog-to-digital converters or more complex application specific integrated circuits, ASICs.

Connectors of the IC chips are connected to conductors of the substrate layer using wire-bonding. The wire-bonds are protected from corrosion, mechanical strain, and short circuit by covering them with a protective material. However, in order to not interfere with dissipation of heat produced by the photodiode layer and the IC chips, the protective material covers as small of a portion of the IC chips as possible while still sufficiently protecting the wire-bonds. Since part of the IC layer is left exposed, a heat sink can be in a direct contact with the bottom surface of the IC layer. Additionally, the heat sink can be configured as a stiffener that provides structural support to the whole device and keeps the device flat.

When a packaged IC chip is traditionally soldered onto a substrate, the packaging includes a substrate onto which the actual IC is wire-bonded, and this substrate in turn includes contact pads that are used in the soldering. Now that the IC chips are connected to the pixels of the photodiode layer directly using wire-bonding, there is no need for any additional substrates. Thus, less material is needed in manufacturing, which can reduce cost and size of the device. Additionally, since the surface of the IC chips can be left exposed while still protecting the wire-bonds, the heat dissipation capability of the device can be improved. Lastly, since the heat sink is used as a stiffener, there is no need for additional support structures or stiff ceramic substrates, which can further reduce the cost and size of the device.

Figure 1:
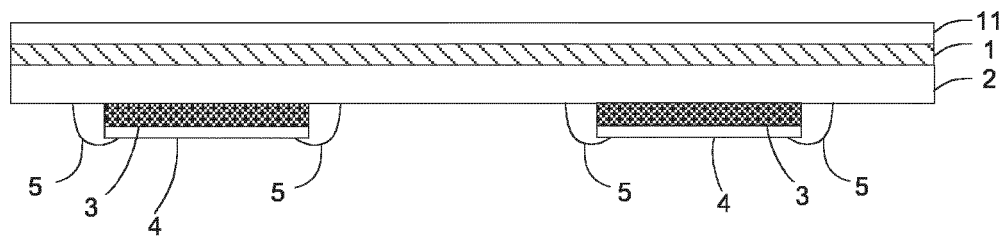
FIG. 1 illustrates a schematic representation of a cross section side view of a radiation detector device showing a scintillator layer, a photodiode layer, a substrate, an x-ray blocking layer, a readout integrated circuit, and wire-bonds according to an embodiment.

FIG. 1 illustrates a schematic representation of a cross section side view of a partially assembled radiation detector device showing a scintillator layer 11, a photodiode layer 1, a substrate 2, an x-ray blocking layer 3, two IC chips 4, and wire-bonds 5 according to an embodiment.

The scintillator layer 11 is configured to convert high energy electromagnetic radiation, such as x-rays or gamma rays, into visible light. The photodiode layer 1 is, in turn, configured to convert these photons of visible light into electric charges. When a bias voltage is applied over the photodiode layer 1 in the vertical direction, the generated charges move along the bias, and an electric current is generated. Since the rate of charge generation is dependent on the intensity of the incident electromagnetic radiation, the generated electric current is different in different parts of the photodiode layer 1. Thus, by introducing an array of electric conductors below the photodiode layer 1, the current distribution can be measured, and this information can in turn be used to construct an image of the incident high energy radiation, where the amount of current in each conductor functions as a pixel in the image.

In addition to being the foundation upon which the photodiode layer 1 is deposited, the substrate 2 under the photodiode layer 1 also functions as a redistribution layer that routes conductors from the pixels in the photodiode layer 1 to electrical contacts on the bottom side of the substrate 2. These contacts are positioned is such a way that they are compatible with the position of the IC chip 4 contacts in the IC layer. Additionally, output signals from the IC chips 4 can also be routed out from the device using the substrate layer 2 by introducing additional connectors to, for example, areas of the bottom surface of the substrate 2, where there are no IC chips covering the substrate 2. Electrical contacts of the IC chips 4 are connected to the contacts on the bottom surface of the substrate using wire-bonds 5 so that the IC chips are electrically connected to the pixels in the photodiode layer. It should be noted that although only two IC chips 4 are presented in the figure, this is only an example and the number of IC chips can generally be significantly higher. The same applies for the wire-bonds 5. Even though only two wire-bonds 5 are depicted for each IC chip, generally a much higher number of wire-bonds is required to connect a single IC chip 4 to the pixels of the photodiode layer. Additionally, for protecting the electronics inside the IC chips from the high energy electromagnetic radiation, there is an x-ray blocking layer 3 between the substrate 2 and the IC chips 4. This layer can comprise, for example, Tungsten.

Figure 2:
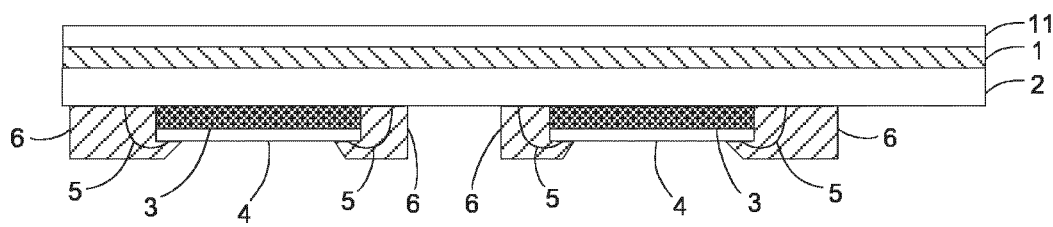
FIG. 2 illustrates a schematic representation of another embodiment of a detector device, where the protective material covers the wire-bonds.

FIG. 2 illustrates a schematic representation of a cross section side view of a further assembled radiation detector device similar to that of FIG. 1 according to an embodiment. However, now the wire-bonds 5 are covered with a protective material 6.

The protective material 6 protects the wire-bonds 5 against corrosion, mechanical strain, and short circuit. The material 6 covers only the wire-bonds 5 and parts of the substrate 2, blocking layer 3, and the IC chips 4 that are in the vicinity of the wire-bonds 5, while most of the surface area of the substrate 2 and the IC chips 4 is left exposed. This type of accurate control of the protective material distribution can be achieved by using, for example, film-assisted moulding, FAM.

Figure 3:
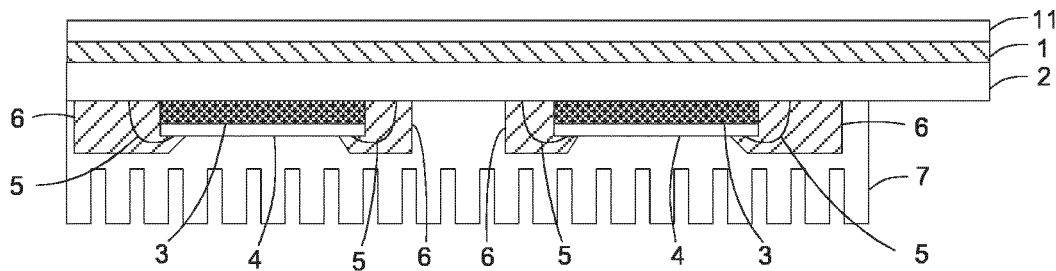
FIG. 3 illustrates a schematic representation of another embodiment of a detector device, where the protective material covers the wire-bonds and the device further comprises a heat sink that is in direct contact with the IC chips.

FIG. 3 illustrates a schematic representation of a cross section side view of a complete radiation detector device according to an embodiment. Compared to the device of FIG. 4, the device further comprises a heat sink 7.

The heat sink 7 can be in a direct contact with surface of the IC chips 4, because the protective material 6 only covers a small portion of the IC chip surface. Thus, improved heat transfer is possible from the IC chips to the heat sink, and therefore heat dissipation of the whole device is improved. Additionally, the heat sink can be configured to function as a stiffener to provide structural support to the device and to keep the device flat, which eliminates the need for any additional structural support such as stiff ceramic substrates.

Figure 4:
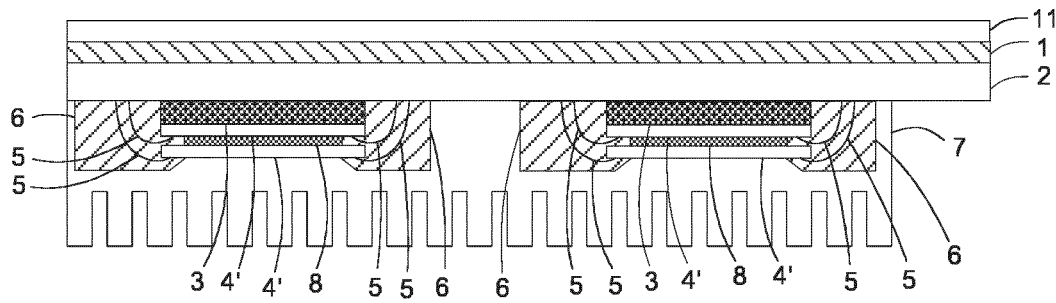
FIG. 4 illustrates a schematic representation of another embodiment of a detector device, where the IC layer comprises multiple layers of stacked IC chips.

FIG. 4 illustrates a schematic representation of a cross section side view of a radiation detector device, where multiple IC chips 4' are stacked on top of each other, and where the chips 4' are separated from each other using a spacer 8 between each stacked chip pair according to an embodiment.

Like with a single IC chip, each of the stacked IC chips 4' is wire-bonded to electrical contacts on the bottom side of the substrate 2. Furthermore, only a single x-ray blocking layer 3 is used between the stack of IC chips 4' and the substrate 2. Although in the figure only two stacked IC chips 4' are depicted, this is only an example and the number of stacked IC chips 4' can be higher.

By stacking multiple IC chips on top of each other, the total surface area taken by the chips can be reduced compared to a non-stacked configuration. Thus, for example, smaller amounts of protective material needs to be used and the size of the substrate can be smaller, which can reduce manufacturing costs and make smaller devices possible.

Figure 5:
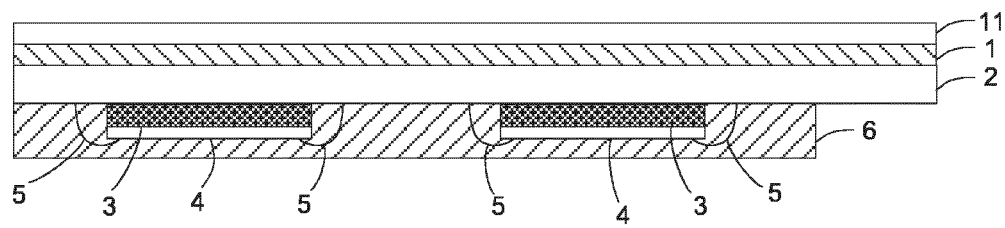
FIG. 5 illustrates a schematic representation of another embodiment of a radiation detector device, where the x-ray blocking layer, the IC layer, and wire-bonds have been covered with a protective material.

FIG. 5 illustrates a schematic representation of a cross section side view of an alternative implementation of a partially assembled radiation detector device, where the protective material 6 covers the whole surface area of the IC chips 4 in addition to the wire-bonds 5 according to an embodiment.

Since the whole IC chips 4 are covered with a protective material, the distribution of the protective material does not need to be controlled as accurately as with the embodiment presented in FIG. 3. Thus, the manufacturing process can be significantly simpler than with the previously presented implementation.

Figure 6:
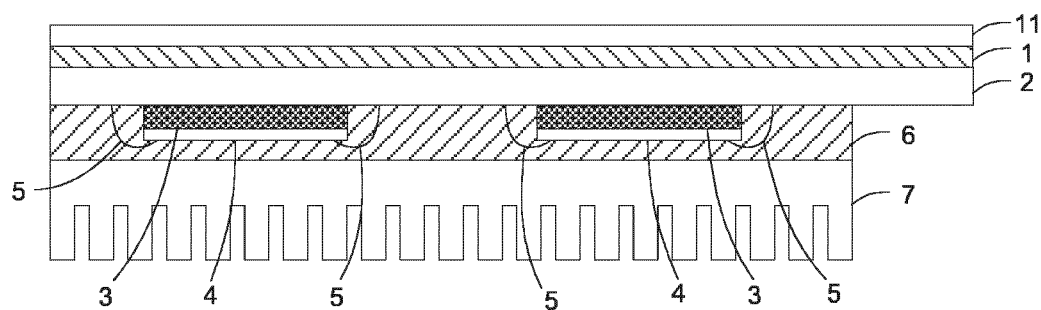
FIG. 6 illustrates a schematic representation of another embodiment of a detector device, where the device further comprises a heat sink.

FIG. 6 illustrates a schematic representation of a cross section side view of another alternative embodiment of the radiation detector device, where the protective material 6 covers the whole surface area of the IC chips 4, and the device further comprises a heat sink 7 according to an embodiment.

Since the protective material 6 covers the whole surface of the IC chips 4, the heat sink 7 cannot be in a direct contact with the chips 4. Thus, the heat dissipation of this device is worse than of the embodiment presented in FIG. 3. However, in addition to the easier moulding of the protective material described above, attaching the heat sink 7 on a flat surface can be significantly easier, which can further simplify the manufacturing process. Additionally, the top surface of the heat sink 7 can also be flat, which can simplify manufacturing of the heat sink.

Figure 7:
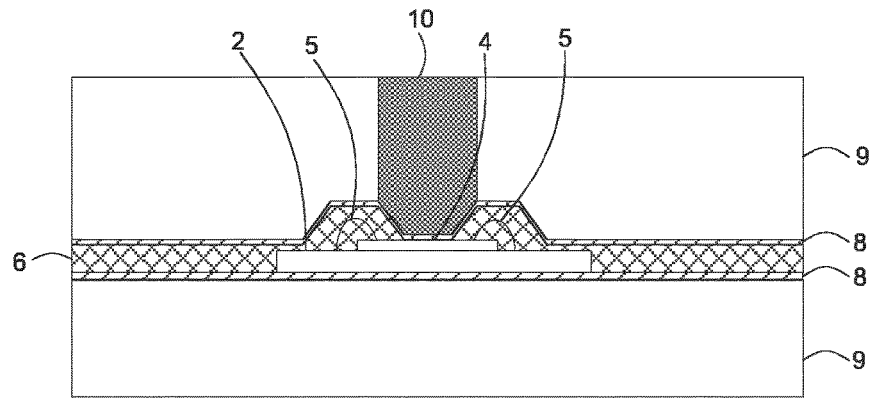
FIG. 7 illustrates a schematic representation of a film-assisted moulding process configured to an embodiment.

FIG. 7 illustrates a schematic representation of a film-assisted moulding, FAM, process according to an embodiment. The process includes a substrate 2, an IC chip 4, wire-bonds 5, a protective material 6, two Teflon based films 8, two moulds 9, and a dynamic insert 10.

In the FAM process, the Teflon based films 8 are sucked down onto the inner surfaces of the moulds 9. The mould is filled with the protective material, while the dynamic insert 10 is pressed onto the IC chip 4 and pressure of the insert is continuously monitored and adjusted. During the process, the protective material 6 hardens, and the top surface of the IC chip 4 is left exposed due to the dynamic insert 10.

Figure 8:
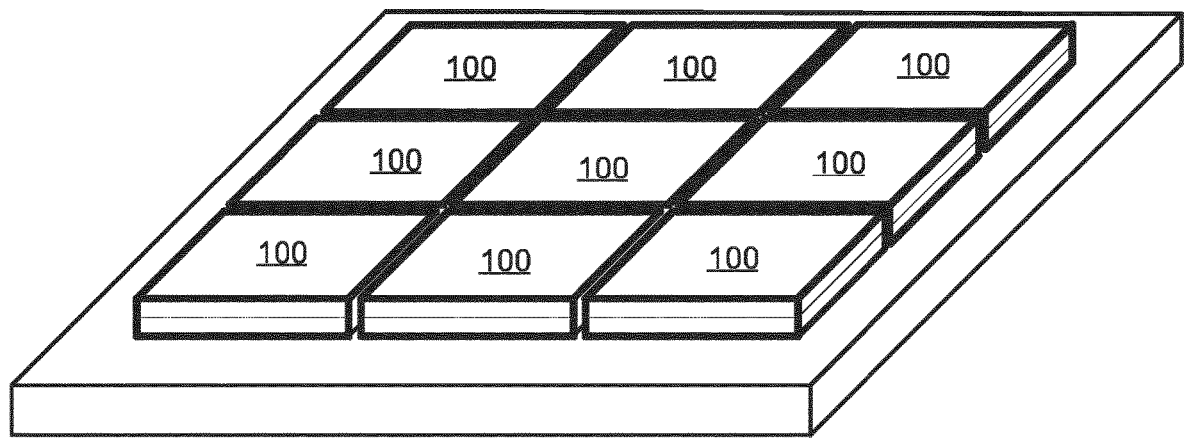
FIG. 8 illustrates a schematic representation of an embodiment of a radiation detector array comprising of multiple radiation detector devices.

FIG. 8 illustrates a schematic representation of an array of radiation detector devices 100 according to an embodiment. It should be noted that the number of devices 100 of the array and the shape of the array may vary.

It will be understood that the benefits and advantages described above may relate to one embodiment or may relate to several embodiments. The embodiments are not limited to those that solve any or all of the stated problems or those that have any or all of the stated benefits and advantages. It will further be understood that reference to 'an' item refers to one or more of those items.

The steps of the methods described herein may be carried out in any suitable order, or simultaneously where appropriate. Additionally, individual blocks may be deleted from any of the methods without departing from the spirit and scope of the subject matter described herein. Aspects of any of the examples described above may be combined with aspects of any of the other examples described to form further examples without losing the effect sought.

The term 'comprising' is used herein to mean including the method, blocks or elements identified, but that such blocks or elements do not comprise an exclusive list and a method or apparatus may contain additional blocks or elements.

It will be understood that the above description is given by way of example only and that various modifications may be made by those skilled in the art. The above specification, examples and data provide a complete description of the structure and use of exemplary embodiments. Although various embodiments have been described above with a certain degree of particularity, or with reference to one or more individual embodiments, those skilled in the art could make numerous alterations to the disclosed embodiments without departing from the spirit or scope of this specification.

The invention claimed is:

1. A device, comprising:
a scintillator layer configured to convert x-ray or gamma ray photons into photons of visible light;
a photodiode layer configured to convert visible light produced by the scintillator layer into an electric current;
an integrated circuit, IC, layer situated below the photodiode layer, the IC layer comprising one or more IC chip configured to receive, process and analyse the electric current;
wherein electrical contacts of the IC layer are connected to electrical contacts of the photodiode layer using wire-bonding;
and wherein the wire-bonding is covered with a protective material while bottom part of the IC layer is left at least partly exposed.

2. The device of claim 1, wherein the device further comprises a heat sink below the IC layer.

3. The device of claim 2, wherein a bottom surface of the IC layer is in a direct contact with the heat sink.

4. The device of claim 2, wherein the heat sink is further configured as a stiffener.

5. The device of claim 1, wherein the device further comprises an x-ray blocking layer between the photodiode layer and the IC layer.

6. The device of claim 1, wherein electrical contacts of the IC layer are directly connected to electrical contacts of the photodiode layer.

7. The device of claim 1, wherein the photodiode layer further comprises a redistribution layer.

8. The device of claim 1, wherein the wire-bonding is covered using film-assisted moulding.

9. The device of claim 1, wherein the IC layer comprises multiple layers of stacked IC chips.

10. The device of claim 1, wherein the device comprises a tile.

11. A detector comprising an array of tiles according to claim 10.

12. An imaging system, comprising:
- an x-ray or gamma ray radiation source; and
- a detector comprising a device comprising:
- a scintillator layer configured to convert x-ray or gamma ray photons into photons of visible light;
- a photodiode layer configured to convert visible light produced by the scintillator layer into an electric current;
- an integrated circuit, IC, layer situated below the photodiode layer, the IC layer comprising one or more IC chip configured to receive, process and analyse the electric current;
- wherein electrical contacts of the IC layer are connected to electrical contacts of the photodiode layer using wire-bonding;
- and wherein the wire-bonding is covered with a protective material while bottom part of the IC layer is left at least partly exposed.

* * * * *